United States Patent
Maeda

(10) Patent No.: US 6,700,945 B2
(45) Date of Patent: Mar. 2, 2004

(54) PHASE LOCK LOOP CIRCUIT

(75) Inventor: Minoru Maeda, Kanagawa (JP)

(73) Assignee: Ando Electric Co., Ltd., Tokyo (JP)

( * ) Notice: Subject to any disclaimer, the term of this patent is extended or adjusted under 35 U.S.C. 154(b) by 358 days.

(21) Appl. No.: 09/847,565

(22) Filed: May 2, 2001

(65) Prior Publication Data

US 2002/0012412 A1 Jan. 31, 2002

(30) Foreign Application Priority Data

Jun. 28, 2000 (JP) ..................................... P.2000-194402

(51) Int. Cl.$^7$ ................................................ H03D 3/24
(52) U.S. Cl. ...................................... 375/376; 327/156
(58) Field of Search ................................ 375/376, 375; 327/156, 147, 160

(56) References Cited

U.S. PATENT DOCUMENTS

| 4,629,999 A | * | 12/1986 | Hatch et al. | ................. | 331/1 R |
| 5,422,678 A | * | 6/1995 | Takeuchi | ..................... | 348/581 |
| 6,044,124 A | * | 3/2000 | Monahan et al. | ........... | 375/376 |

FOREIGN PATENT DOCUMENTS

| EP | 1030453 A1 | * | 8/2000 |
| JP | 4-212522 | | 8/1992 |

* cited by examiner

*Primary Examiner*—Temesghen Ghebretinsae
(74) *Attorney, Agent, or Firm*—Fish & Richardson P.C.

(57) ABSTRACT

A phase lock loop circuit includes operation means (CPU) 15 for previously calculating divider control data 11 to obtain a division number corresponding to an output frequency, and a divider switching memory circuit 2 for writing the divider control data 11 and reading a division value 10 every time an output 9 of a variable divider 1 is generated, thereby controlling the variable divider 1.

6 Claims, 4 Drawing Sheets

PRINCIPLE OF NOISE SUPPRESSION OF VOLTAGE CONTROL OSCILLATOR
OUTPUT THROUGH NOISE SHAPING (INCREASE IN BAND) IN PHASE LOCK LOOP

SIGNAL DIAGRAM OF TERTIARY MASH TYPE CONVERTER

PHASE LOCK LOOP CIRCUIT

BACKGROUND OF THE INVENTION

1. Field of the Invention

The present invention relates to a phase lock loop circuit, and more particularly to a phase lock loop circuit suitable for constituting a frequency synthesizer capable of obtaining an output frequency having a higher frequency resolution than a reference frequency by utilizing a fractional division.

2. Description of the Related Art

FIG. 8 is a block diagram showing a conventional phase lock (PLL) loop circuit.

As shown in FIG. 8, the phase look loop circuit has such a structure that an output of a voltage control oscillator 27 is divided by a variable divider 21, and the output thus divided is phase compared with a reference signal 25 in a phase comparator 24 and is connected to a frequency control input 34 of the voltage control oscillator 27 through an LPF 26.

A fractional division produces the following equation by using some variable divisions:

Average division number=N+L/A.

In a division switching calculating circuit 31, a division value to be set next is calculated through a variable divider output 29. After the calculation, the variable divider 21 is controlled through a division switching control circuit 22.

In the case of such fractional division control, for example, a ΣΔ (sigma delta) modulator is used as a modulating method of increasing a band of a noise generated through division value switching of a divider (noise shaping) in accordance with a calculation algorithm.

As a specific example of the ΣΔ (sigma delta) modulator, a tertiary MASH type ΣΔ (sigma delta) modulator shown in FIG. 7 has been described in "Oversampling A-D Converting Technique" written by Akira Yukawa, Nikkei BP Co., Ltd. Moreover, JP-A-4-212522 has disclosed an example in which the ΣΔ (sigma delta) modulator is used for a PLL synthesizer.

In the conventional phase lock loop circuit, however, every time the variable divider output 29 is generated, a next fractional division value is calculated through an operation circuit (hardware) or a software operation in accordance with an algorithm. Therefore, a constant time is required for the calculation. In the algorithm, a dependent connection type is used as in the MASH type ΣΔ (sigma delta) modulation. Therefore, a long time is required for the operation. Moreover, the operation circuit (hardware) for the calculation is also complicated.

In such a circuit structure, moreover, a constant time is required for divider switching and a reference frequency is reduced.

Furthermore, there is also a problem in that the phase lock loop has a small noise suppression frequency width and a long time required for frequency switching.

SUMMARY OF THE INVENTION

The invention has been made in consideration of the problems and has an object to implement a phase lock loop circuit capable of realizing a fractional dividing circuit with a simple circuit, carrying out divider switching at a high speed, setting a reference frequency to be high, and furthermore, setting a noise suppression frequency width to be great through a phase lock loop and also shortening a time required for frequency switching.

In order to achieve the object, according to a first aspect of the invention, there is provided a phase lock loop circuit for switching a division ratio of a variable divider, thereby carrying out a fractional division, comprising a variable divider capable of varying a division ratio of an output of a voltage control oscillator in response to a divider control signal, operation means for previously calculating divider control data for obtaining a division number corresponding to an output frequency, a divider switching memory circuit for writing the divider control data and reading the data every time an output of the variable divider is generated, thereby setting a division value of the variable divider, a phase comparator for phase comparing the output of the variable divider with a reference frequency, an LPF (low-pass filter) for inputting an output of the phase comparator and removing a high frequency component, and the voltage control oscillator capable of changing an oscillation frequency through an output of the LPF (low-pass filter).

Moreover, according to a second aspect of the invention, there is provided the phase lock loop circuit according to the first aspect wherein the variable divider can switch a division ratio, thereby obtaining an average division number (N+L/A) (N, L and A are integers)

Furthermore, according to a third aspect of the invention, there is provided the phase lock loop circuit according to the first or second aspect wherein the operation means previously calculates a division value in accordance with a calculation algorithm through ΣΔ (sigma delta) modulation.

Moreover, according to a fourth aspect of the invention, there is provided the phase lock loop circuit according to any one of the first to third aspects wherein the divider switching memory circuit writes the divider control data to a memory, counts divider outputs through a counter to set a read address of the memory, and transmits read data to the variable divider, thereby setting a division value.

Furthermore, according to a fifth aspect of the invention, there is provided the phase lock loop circuit according to any one of the first to third aspects wherein the memory includes a plurality of memory blocks, writes the divider control data having different frequencies to the different memory blocks for the respective frequencies and switches the memory blocks for reading, thereby changing over the frequencies.

DETAILED DESCRIPTION OF THE PREFERRED EMBODIMENTS

A phase lock loop circuit according to an embodiment of the invention will be described below in detail with reference to the accompanying drawings.

Figure 1:
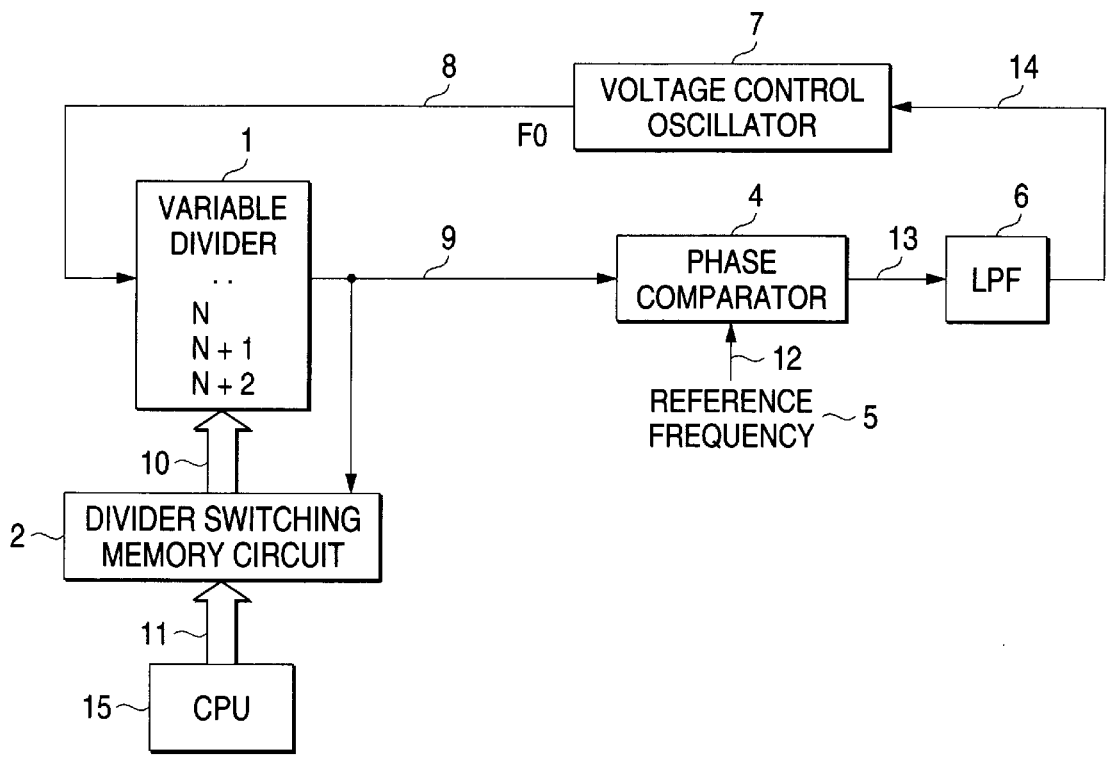
FIG. 1 is a block diagram showing a phase lock loop circuit according to the invention.

FIG. 1 is a block diagram showing a phase lock loop circuit according to the invention.

The phase lock loop circuit according to the invention serves to carry out a fractional division through a variable divider 1 capable of varying a division ratio of an output 8 of a voltage control oscillator 7 like N−1, N, N+1, . . . as shown in FIG. 1.

The fractional division produces the following equation by using some variable divisions:

Average division number=N+L/A

The phase lock loop circuit according to the invention is characterized by operation means (CPU) 15 for previously calculating divider control data 11 for obtaining a division number corresponding to an output frequency, and a divider switching memory circuit 2 for writing the divider control data 11 and reading a division value 10 every time an output 9 of the variable divider 1 is generated, thereby controlling the variable divider 1.

Moreover, there are provided a phase comparator 4 for phase comparing the output 9 of the variable divider 1 with a reference frequency 5, an LPF (low-pass filter) 6 for inputting an output 13 and removing a high frequency component, and a voltage control oscillator 7 capable of changing an oscillation frequency through an output 14 of the LPF (low-pass filter).

Next, specific detailed description will be given to first and second embodiments of the divider switching memory circuit 2 and the operation means (CPU) 15 which are features of the invention.

First Embodiment

Figure 2:
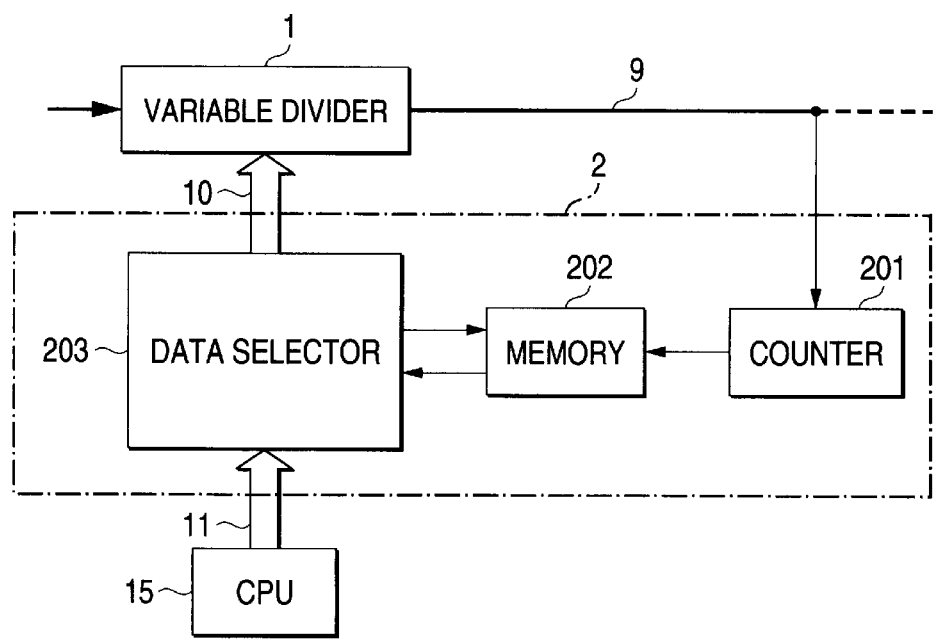
FIG. 2 is a block diagram showing a variable divider, a divider switching memory circuit and operation means (CPU) according to a first embodiment.

FIG. 2 is a block diagram showing a variable divider 1, a divider switching memory circuit 2 and operation means (CPU) 15 according to the first embodiment.

When a fractional division (N+L/A) (N, L and A are integers) is to be obtained, the operation means (CPU) 15 carries out an operation in the following procedure.

Figure 7:
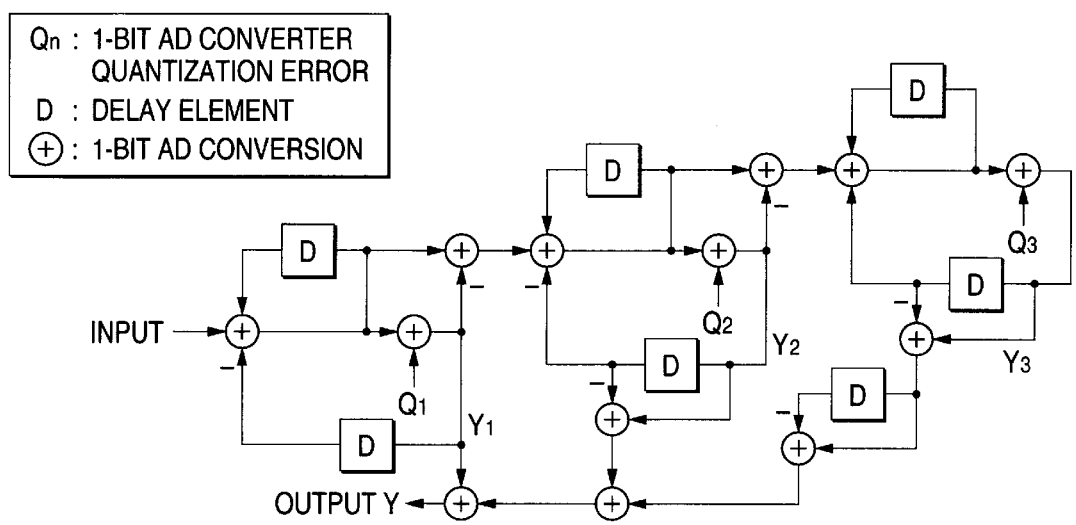
FIG. 7 is a signal diagram of a tertiary MASH type ΣΔ (sigma delta) modulator.
Figure 8:
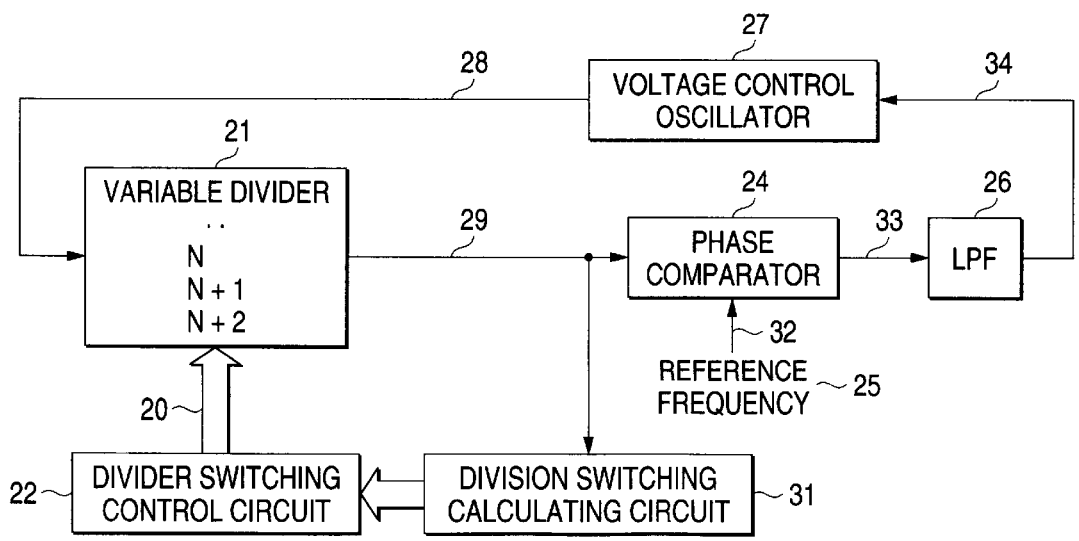
FIG. 8 is a block diagram showing a conventional phase lock loop circuit.

(1) The integers L and A are calculated once in accordance with a calculation algorithm shown in a signal diagram of FIG. 7 illustrating a MASH type ΣΔ (sigma delta) modulator, for example, and a value obtained by adding a result of the calculation to N is written to a first memory address in a memory 202.

(2) Subsequently, a second calculation is carried out and a value obtained by adding a result of the calculation to N is written to a second memory address in the memory 202.

(3) Similarly, a third calculation is carried out and a value obtained by adding a result of the calculation to N is written to a third memory address in the memory 202.

In the same manner, subsequently, an Mth calculation is carried out and a value obtained by adding a result of the calculation to N is written to an Mth memory address in the memory 202. A value of M indicates the number of times for circulation of the result of the calculation.

Next, the number of outputs is counted from the output 9 of the variable divider 1 through a counter 201. The number obtained by the counting is set to be a read address of the memory 202 (when the count number is M, an original address is returned).

Finally, a division value 10 of the variable divider 1 is set based on data read from the divider switching memory circuit 2.

Moreover, a data selector 203 carries out switching between an operation for writing data from the CPU 15 to the memory 202 and an operation for reading the data from the memory 202 to the variable divider 1.

After the data are not written to the memory each time but the Mth calculation is completed, the results of the calculation may be collectively transferred and written to the memory.

Second Embodiment

Figure 3:
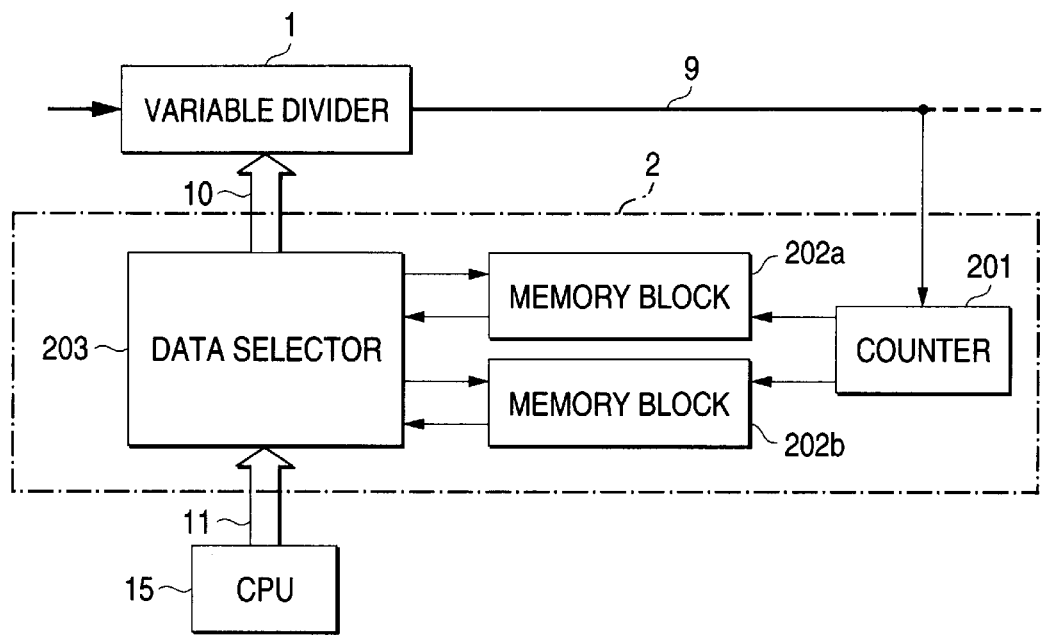
FIG. 3 is a block diagram showing a variable divider, a divider switching memory circuit and operation means (CPU) according to a second embodiment.

FIG. 3 is a block diagram showing a variable divider 1, a divider switching memory circuit 2 and operation means (CPU) 15 according to a second embodiment. A memory includes two memory blocks 202*a* and 202*b*.

When a fractional division (N1+L1/A1) (N1, L1 and A1 are integers) is to be first set and a fractional division (N2+L2/A2) (N2, L2 and A2 are integers) is to be next obtained, the operation means (CPU) 15 carries out an operation in the following procedure.

(1) First of all, division data corresponding to the fractional division of (N1+L1/A1) are calculated and written to the memory block 202*a*.

(2) Next, division data corresponding to the fractional division of (N2+L2/A2) are calculated and written to the memory block 202*b*.

(3) The circuit is first set to read the data from the memory block 202*a*.

(4) When a next division is to be set, the circuit is set to read the data from the memory block 202*b*.

In such a case, two fractional division values are switched. If data are written to a plurality of memory blocks and the reading blocks are sequentially switched, the fractional division value can be changed continuously.

Figure 4:
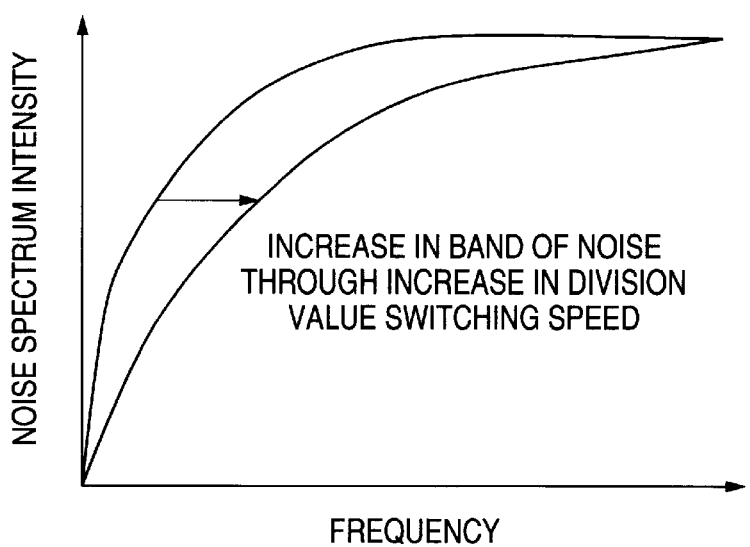
FIG. 4 is a typical graph illustrating an increase in a band of a noise through an increase in a division value switching speed.

In the invention, the divider switching can be carried out at a high speed. Therefore, a frequency band of a noise can be increased as shown in FIG. 4.

Figure 5:
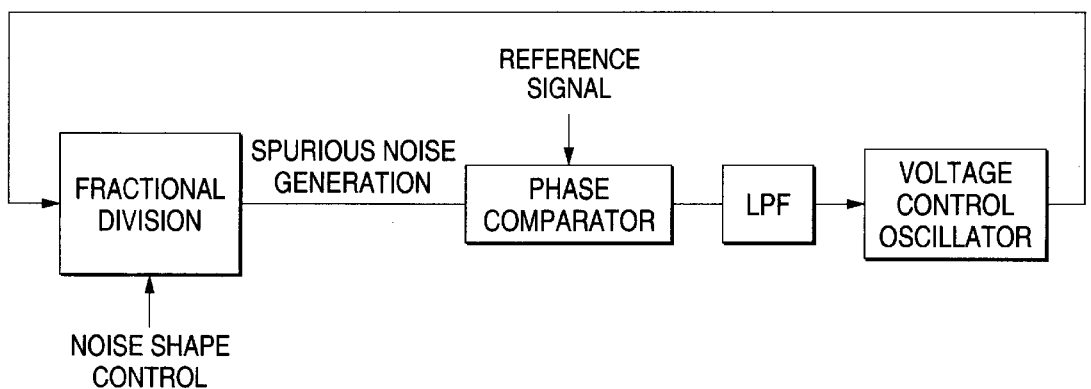
FIG. 5 is a diagram illustrating the principle of noise suppression of a voltage control oscillator output through noise shaping (an increase in a band) in a phase lock loop.

Description will be given to the principle of noise suppression of a voltage control oscillator output through noise shaping (an increase in a band) in the phase lock loop. As shown in FIG. 5, loop control is carried out to set the output to be identical to a reference signal in the phase lock loop. For this reason, when a fractional division output for generating a sprious is phase locked with the reference signal, a sprious having an opposite phase is generated on the voltage control oscillator.

Figure 6:
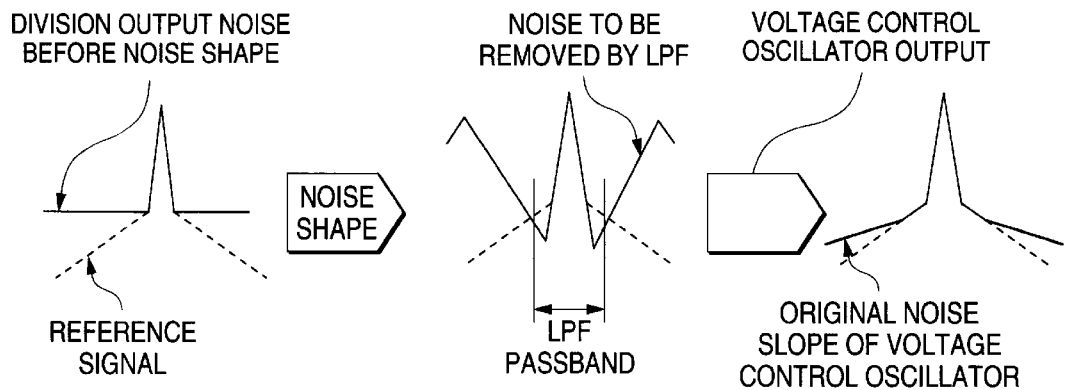
FIG. 6 is a waveform diagram illustrating the noise shaping.

As shown in FIG. 6, a band of a noise made in the vicinity of a division output is increased through noise shaping and the vicinity of a division output having no noise is phase locked with the reference signal so that a wideband noise can be removed through the LPF.

As described above in detail, the phase lock loop circuit according to the invention does not require a time and circuit for calculating a next division set value every time a division output is generated. Therefore, a fractional dividing circuit can be implemented with a very simple circuit (for simply reading division value data). Therefore, a high-speed operation can be carried out.

Moreover, divider switching can be carried out at a high speed. Therefore, a frequency band can be increased through the noise shaping. Consequently, a reference frequency can be set to be high.

Furthermore, a noise suppression frequency width can be set to be great through the phase lock (PLL) loop and a time required for the frequency switching can also be shortened.

What is claimed is:

1. A phase lock loop circuit for switching a division ratio of a variable divider to carry out a fractional division, comprising:

a voltage control oscillator;

a variable divider for varying a division ratio of an output of a voltage control oscillator in response to a divider control signal;

an operation unit for previously calculating divider control data to obtain a division number corresponding to an output frequency;

a divider switching memory circuit for writing the divider control data and reading the data every time an output of the variable divider is generated, to set a division value of the variable divider;

a phase comparator for phase comparing the output of the variable divider with a reference frequency; and a low-pass filter for inputting an output of the phase comparator and removing a high frequency component;

wherein said voltage control oscillator changes an oscillation frequency through an output of said low-pass filter, and wherein said variable divider switches a division ratio to obtain an average division number (N+L/A), where N, L and A are integers.

2. The phase lock loop circuit according to claim 1, wherein said operation unit previously calculates a division value in accordance with a calculation algorithm through ΣΔ (sigma delta) modulation.

3. A phase lock loop circuit for switching a division ratio of a variable divider to carry out a fractional division, comprising:

a voltage control oscillator;

a variable divider for varying a division ratio of an output of a voltage control oscillator in response to a divider control signal;

an operation unit for previously calculating divider control data to obtain a division number corresponding to an output frequency;

a divider switching memory circuit for writing the divider control data and reading the data every time an output of the variable divider is generated, to set a division value of the variable divider;

a phase comparator for phase comparing the output of the variable divider with a reference frequency; and a low-pass filter for inputting an output of the phase comparator and removing a high frequency component;

wherein said voltage control oscillator changes an oscillation frequency through an output of said low-pass filter, and wherein said divider switching memory circuit writes the divider control data to a memory, counts divider outputs through a counter to set a read address of the memory, and transmits read data to said variable divider, to set a division value.

4. A phase lock loop circuit for switching a division ratio of a variable divider to carry out a fractional division, comprising:

a voltage control oscillator;

a variable divider for varying a division ratio of an output of a voltage control oscillator in response to a divider control signal;

an operation unit for previously calculating divider control data to obtain a division number corresponding to an output frequency;

a divider switching memory circuit for writing the divider control data and reading the data every time an output of the variable divider is generated, to set a division value of the variable divider;

a phase comparator for phase comparing the output of the variable divider with a reference frequency; and a low-pass filter for inputting an output of the phase comparator and removing a high frequency component;

wherein said voltage control oscillator changes an oscillation freciuency through an output of said low-pass filter, and wherein said memory includes a plurality of memory blocks, writes the divider control data having different frequencies to the different memory blocks for the respective frequencies and switches the memory blocks for reading, to change over the frequencies.

5. The phase lock loop circuit according to claim 4, wherein said operation unit previously calculates a division value in accordance with a calculation algorithm through ΣΔ (sigma delta) modulation.

6. The phase lock loop circuit according to claim 5, wherein said operation unit previously calculates a division value in accordance with a calculation algorithm through ΣΔ (sigma delta) modulation.

* * * * *